(12) United States Patent
Chung

(10) Patent No.: US 9,007,804 B2
(45) Date of Patent: Apr. 14, 2015

(54) CIRCUIT AND SYSTEM OF PROTECTIVE MECHANISMS FOR PROGRAMMABLE RESISTIVE MEMORIES

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 136 days.

(21) Appl. No.: 13/761,045

(22) Filed: Feb. 6, 2013

(65) Prior Publication Data

US 2013/0201748 A1    Aug. 8, 2013

Related U.S. Application Data

(60) Provisional application No. 61/595,167, filed on Feb. 6, 2012.

(51) Int. Cl.

| | | |
|---|---|---|
| G11C 17/00 | (2006.01) | |
| G11C 13/00 | (2006.01) | |
| G11C 8/20 | (2006.01) | |
| G11C 11/16 | (2006.01) | |
| G11C 17/16 | (2006.01) | |

(52) U.S. Cl.
CPC ............ *G11C 13/0002* (2013.01); *G11C 17/00* (2013.01); *G11C 8/20* (2013.01); *G11C 11/16* (2013.01); *G11C 13/0004* (2013.01); *G11C 13/0007* (2013.01); *G11C 13/0011* (2013.01); *G11C 13/0059* (2013.01); *G11C 17/16* (2013.01); *G11C 2213/72* (2013.01); *G11C 11/1695* (2013.01)

(58) Field of Classification Search
CPC ......................... G11C 13/0004; G11C 13/0069
USPC .......................................... 365/100, 148, 163
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

U.S. Appl. No. 13/471,704, filed May 15, 2012.

(Continued)

*Primary Examiner* — Huan Hoang

(57) ABSTRACT

Programmable resistive memory using at least one diodes as program selectors can be data protected by programming protection bits in a non-volatile protection bit register. The data stored in the protection bit register can be used to enable or disable reading or writing in part or the whole programmable resistive memory. The data stored in the protection bit register can also be used to enable or enable scrambling the addresses to allow accessing the programmable resistive memory array. Similarly, the data stored in the protection bit register can be used to scramble data when writing into and descramble data when reading from the programmable resistive memory. Keys can be provided for address or data scrambling. The non-volatile protection bit register can be built with the kind of cells as the main array and/or integrated with the main array in the programmable resistive memory.

20 Claims, 10 Drawing Sheets

(56) References Cited

U.S. PATENT DOCUMENTS

| | | |
|---|---|---|
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A | 10/1999 | Sung et al. |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimormura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,833,823 B2 | 11/2010 | Klersy |
| 7,859,920 B2 | 12/2010 | Jung et al. |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,760,904 B2 | 6/2014 | Chung |
| 8,817,563 B2 | 8/2014 | Chung |
| 8,830,720 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansal et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1* | 4/2010 | Lu et al. ............ 365/148 |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1* | 1/2011 | Harris et al. ............ 708/254 |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1* | 9/2011 | Lee et al. ............ 365/100 |
| 2011/0260289 A1 | 10/2011 | Oyamada |
| 2011/0297912 A1 | 12/2011 | Samachisa et al. |
| 2011/0312166 A1 | 12/2011 | Yedinak et al. |
| 2012/0032303 A1 | 2/2012 | Elkareh et al. |
| 2012/0044736 A1 | 2/2012 | Chung |
| 2012/0044737 A1 | 2/2012 | Chung |
| 2012/0044738 A1 | 2/2012 | Chung |

(56) References Cited

U.S. PATENT DOCUMENTS

| | | |
|---|---|---|
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0215663 A1 | 8/2013 | Chung |
| 2013/0235644 A1 | 9/2013 | Chung |
| 2013/0268526 A1 | 10/2013 | Johns et al. |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0124871 A1 | 5/2014 | Ko et al. |
| 2014/0124895 A1 | 5/2014 | Salzman et al. |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0211567 A1 | 7/2014 | Chung |
| 2014/0269135 A1 | 9/2014 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 4/2009 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rd. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics,"Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb, 1994, pp. 204-211.
Banerjee, Kaustav et al., "High Current Effects in Salicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.

(56) References Cited

OTHER PUBLICATIONS

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.

(56) References Cited

OTHER PUBLICATIONS

Lee, H.Y. et al., "Low Power and High Speed Bipolar Switching with a Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral TFT Realized Over Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May, 2011, pp. 1508-1516.

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. on Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile IT Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

Rizzolo, R. F. et al., "IBM System z9 eFUSE applications and methodology," IBM J. Res. & Dev. vol. 51 No. 1/2 Jan./Mar. 2007, pp. 65-75.

Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43rd IRPS, 2005, pp. 347-351.

Schrogmeier, P. et al., "Time Discrete Voltage Sensing and Iterative Programming Control for a 4F2 Multilevel CBRAM," VLSI Cir. Symp., Jun. 2007, pp. 186-187.

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

Sheu, Shyh-Shyuan et al., "Fast-Write Resistive RAM (RRAM) for Embedded Applications," IEEE Design & Test of Computers, Jan./Feb. 2011, pp. 64-71.

Shi, Min et al., "Zero-Mask Contact Fuse for One-Time-Programmable Memory in Standard CMOS Processes," IEEE Dev. Lett. vol. 32, No. 7, Jul. 2011, pp. 955-957.

Song, Y. J. et al., "Highly Reliable 256Mb PRAM with Advanced Ring Contact Technology and Novel Encapsulating Technology," IEEE VLSI Tech Symp., Jun. 2006, pp. 153-154.

Suto, Hiroyuki et al., "Programming Conditions for Silicided Poly-Si or Copper Electrically Programmable Fuses," IEEE IIRW Final Report, 2007, pp. 84-89.

Suto, Hiroyuki et al., "Study of Electrically Programmable Fuses Through Series of I-V Measurements," IEEE IIRW Final Report, 2006, pp. 83-86.

Suto, Hiroyuki et al., "Systematic Study of the Dopant-Dependent Properties of Electrically Programmable Fuses With Silicide Poly-Si Links Through a Series of IV Measurements," IEEE Trans. on Dev. Mat. Rd. vol. 7, No. 2, Jun. 2007, pp. 285-297.

Takaoka, H. et al., A Novel Via-fuse Technology Featuring Highly Stable Blow Operation with Large On-off Ratio for 32nm Node and Beyond, IEDM, 2007, pp. 43-46.

Tehrani, S. et al., "Magnetoresistive Random Access Memory Using Magnetic Tunnel Junction," Proc. of IEEE, vol. 91, No. 5, May 2003, pp. 703-714.

Tehrani, S., "Status and Outlook of MRAM Memory Technology," IEEE IEDM Dig. of Tech Paper., Dec. 2006, pp. 1-4.

Teichmann, J. et al., "One Time Programming (OTP) with Zener Diodes in CMOS Processes," 33rd Conf. on European Solid-State Device Research (ESSDERC), 2003, pp. 433-436.

Tian, C. et al., "Reliability Investigation of NiPtSi Electrical Fuse with Different Programming Mechanisms," IEEE IIRW Final Report, 2007, pp. 90-93.

Tian, C. et al., "Reliability Qualification of CoSi2 Electrical Fuse for 90nm Technology," IEEE 44th IRPS, 2006, pp. 392-397.

Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.

Tonti, W. R. et al., "Product Specific Sub-Micron E-Fuse Reliability and Design Qualification," IEEE IIRW Final Report, 2003, pp. 36-40.

Tonti, W. R., "Reliability and Design Qualification of a Sub-Micro Tungsten Silicide E-Fuse," IEEE IRPS Proceedings, 2004, pp. 152-156.

Tonti, W. R., "Reliability, Design Qualification, and Prognostic Opportunity of in Die E-Fuse," IEEE Conference on Prognostics and Health Management (PHM), 2011, pp. 1-7.

Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.

Ulman, G. et al., "A Commercial Field-Programmable Dense eFUSE Array Memory with 00.999% Sense Yield for 45nm SOI CMOS",

(56) References Cited

OTHER PUBLICATIONS

ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704 mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.

(56) References Cited

OTHER PUBLICATIONS

Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-μ m shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n. Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Mar. 31, 2015.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014. (with translation).

(56) References Cited

OTHER PUBLICATIONS

Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.

* cited by examiner

CIRCUIT AND SYSTEM OF PROTECTIVE MECHANISMS FOR PROGRAMMABLE RESISTIVE MEMORIES

CROSS-REFERENCE TO RELATED APPLICATIONS

This application claims priority benefit of U.S. Provisional Patent Application No. 61/595,167, filed on Feb. 6, 2012 and entitled "CIRCUIT AND SYSTEM OF PROTECTION MECHANISMS FOR PROGRAMMABLE RESISTIVE MEMORIES," which is hereby incorporated herein by reference.

BACKGROUND OF THE INVENTION

A programmable resistive device in a programmable resistive memory is generally referred to a device's resistance states that may change after means of programming. Resistance states can also be determined by resistance values. For example, a resistive device can be a One-Time Programmable (OTP) device, such as electrical fuse, and the programming means can apply a high voltage to induce a high current to flow through the OTP element. When a high current flows through an OTP element by turning on a program selector, the OTP element can be programmed, or burned into a high or low resistance state (depending on either fuse or anti-fuse).

An electrical fuse is a common OTP which is a programmable resistive device that can be constructed from a segment of interconnect, such as polysilicon, silicided polysilicon, silicide, metal, metal alloy, or some combination thereof. The metal can be aluminum, copper, other transition metals, or non-aluminum metal gate for CMOS. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The OTP can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

The programmable resistive device can be a reversible resistive device that can be programmed into a digital logic value "0" or "1" repetitively and reversibly. The programmable resistive device can be fabricated from phase change material, such as Germanium(Ge), Antimony(Sb), and Tellurium(Te) with composition $Ge_2Sb_2Te_5$ (GST-225) or GeSbTe-like materials including compositions of Indium (In), Tin (Sn), or Selenium (Se). The phase change material can be programmed into a high resistance amorphous state or a low resistance crystalline state by applying a short and high voltage pulse or a long and low voltage pulse, respectively. The reversible resistive device can be a Resistive RAM (RRAM) with cells fabricated from metal oxides between electrodes, such as Pt/NiO/Pt, TiN/TiOx/HfO2/TiN, TiN/ZnO/Pt. The resistance states can be changed reversibly and determined by polarity, magnitude, duration, or voltage/current-limit of pulse(s) to generate or annihilate conductive filaments. Another programmable resistive device similar to RRAM is a Conductive Bridge RAM (CBRAM) that is based on electrochemical deposition and removal of metal ions in a thin solid-state electrolyte film. The electrodes can be an oxidizable anode and an inert cathode and the electrolyte can be Ag- or Cu-doped chalcogenide glass such as GeSe or GeS, etc. The resistance states can be changed reversibly and determined by polarity, magnitude, duration, or voltage/current-limit of pulse(s) to generate or annihilate conductive bridges. The programmable resistive device can be an MRAM (Magnetic RAM) with cells fabricated from magnetic multi-layer stacks that construct a Magnetic Tunnel Junction (MTJ). In a Spin Transfer Torque MRAM (STT-MRAM) the direction of currents applied to an MTJ determines parallel or anti-parallel states, and hence low or high resistance states.

A conventional programmable resistive memory cell is shown in FIG. 1. The cell 10 consists of a resistive element 11 and an NMOS program selector 12. The resistive element 11 is coupled to the drain of the NMOS 12 at one end, and to a positive voltage V+ at the other end. The gate of the NMOS 12 is coupled to a select signal (Sel), and the source is coupled to a negative voltage V−. When a high voltage is applied to V+ and a low voltage to V−, the resistive device 10 can be programmed by raising the select signal (Sel) to turn on the NMOS 12. One of the most common resistive elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The programmable resistive memory cell 10 can be organized as a two-dimensional array with all V+'s in the same column coupled together as bitlines (BLs) and all Sel's in the same row coupled together as wordlines (WLs).

Another programmable resistive memory cell 15 is shown in FIG. 1(b). The programmable resistive memory cell has a programmable resistive element 16 and a diode 17 as program selector. The programmable resistive element 16 is coupled between an anode of the diode 17 and a high voltage V+. A cathode of the diode 17 is coupled to a low voltage V−. By applying a proper voltage between V+ and V− for a proper duration of time, the programmable resistive element 16 can be programmed into high or low resistance states, depending on voltage/current and duration. The diode 17 can be a junction diode constructed from a P+ active region on N well and an N+ active region on the same N well as the P and N terminals of a diode, respectively. In another embodiment, the diode 17 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The programmable resistive memory cell 15 can be organized as a two-dimensional array with all V+'s in the same column coupled together as bitlines (BLs) and all Sel's in the same row coupled together as wordline bars (WLBs).

Non-volatile memory (NVM) or programmable resistive memory needs to be protected from unauthorized uses, alternations, or inspections, including read or program. FIG. 2 shows a portion of a block diagram of a Micro-Controller Unit (MCU) 20 embedded with flash memory as in Spansion's STR91xFA. The MCU has a flash memory array 21, control logic 22, and an OTP sector 23. The OTP sector 23 has a P-bit and E-bit, which can AND with the Program enable (PE) and Erase enable (EE) generated from the control logic 22 through gates 24 and 25, respectively, to control the PgmEN and EraEN of the flash memory array 21. The data protection bits are built in OTP, which is a different memory from the flash memory array.

Not only NVMs need to be data protected, OTP memories, either stand alone or embedded, needs to be data protected too. And the protection bits and main array do not have to be different kinds of memories. In general, any programmable resistive memory needs to be protected from unauthorized uses, alternations, or inspections, such as read or program. Hence there is a need for inventing more general data-protection mechanisms for programmable resistive memories, such as one-time-programmable (OTP), multiple-time programmable (MTP), or reversible programmable memories such as PCRAM, RRAM, CBRAM, or MRAM, etc.

SUMMARY

The present invention relates to data-protection mechanisms to programmable memory memories, such as inhibiting read or program, or data scramble schemes. Embodiments of data-protection mechanisms for programmable resistive memory cells using diodes as program selectors are disclosed. The diode as program selector can be fabricated in standard CMOS logic processes to reduce cell size and cost.

In one embodiment, the programmable resistive memory can be read or write protected by setting a read lock bit or write lock bit. In another embodiment, the addresses can be scrambled so that the physical locations of data can be hidden. Yet in another embodiment, the data can be encrypted with a key so that the data can be protected from any unauthorized uses.

The invention can be implemented in numerous ways, including as a method, system, device, or apparatus (including graphical user interface and computer readable medium). Several embodiments of the invention are discussed below.

As a programmable resistive memory, one embodiment can, for example, include at least a plurality of programmable resistive cells. At least one of the programmable resistive cells can include at least a programmable resistive element coupled to at least one diodes as program selectors fabricated in standard CMOS process, and at least one non-volatile register to store protection bit information. The data stored in the protection bit register can be used to enable or disable read or write operations, or to scramble addresses or data when accessing the programmable resistive memory.

As a data-protection mechanism for programmable resistive memory, one embodiment can, for example, include at least one data-protection bit. The data-protection bit can prevent the contents of the programmable resistive memory from being written or read. In other embodiments, the protection bit can allow the addresses or data being scrambled. Moreover, keys can be provided to assist addresses or data scrambling. The protection bits and keys are stored in a non-volatile memory, the same kind of memory as the memory to be protected. The programmable resistive memory has a plurality of programmable resistive cells that can include at least one programmable resistive element coupled to at least one diode as program selector. The diode as program selector can be built from a junction diode with a P+ active on an N well and an N+ active on the same N well as the two terminals of the diode, respectively. In another embodiment, the diode can be built in a polysilicon structure with two ends implanted by P+ and N+ dopants, respectively, as the two terminals of the diode. In yet another embodiment, the diode can be built in an isolated active region with two ends implanted by P+ and N+ dopants, respectively, as the two terminals of the diode. The P+ and N+ terminals of either junction diode, polysilicon diode, or active-region diode can be implanted with the same source or drain implants of CMOS devices in standard CMOS processes, and the well of the junction diode can be fabricated from CMOS wells.

As an electronics system, one embodiment can, for example, include at least a processor, and a programmable resistive memory operatively connected to the processor. The data-protection mechanism for programmable resistive memory, one embodiment can, for example, include at least one protection bit. The protection bit can prevent the contents of the programmable resistive memory from being written or read. In other embodiments, the protection bit can allow the addresses or data being scrambled. Moreover, keys can be provided to assist addresses or data scrambling. The protection bits and keys are stored in a non-volatile memory, the same kind of memory as the memory to be protected. The programmable resistive memory has a plurality of programmable resistive cells that can include at least one programmable resistive element coupled to at least one diode as program selector. The diode as program selector can be built from a junction diode with a P+ active on an N well and an N+ active on the same N well as the two terminals of the diode, respectively. In another embodiment, the diode can be built in a polysilicon structure with two ends implanted by P+ and N+ dopants, respectively, as the two terminals of the diode. In yet another embodiment, the diode can be built in an isolated active region with two ends implanted by P+ and N+ dopants, respectively, as the two terminals of the diode. The P+ and N+ terminals of either junction diode, polysilicon diode, or active-region diode can be implanted with the same source or drain implants of CMOS devices in standard CMOS processes, and the well of the junction diode can be fabricated from CMOS wells.

As a method for providing protection mechanisms for a programmable resistive memory, one embodiment can, for example, include at least one data-protection bit. The protection bit can disable the contents of the programmable resistive memory from being written or read. In other embodiments, the protection bit can enable the addresses or data scrambling. Moreover, keys can be provided to assist addresses or data scrambling. The protection bits and keys are stored in a non-volatile memory, the same kind of memory as the memory to be protected. The programmable resistive memory has a plurality of programmable resistive cells that can include at least one programmable resistive element coupled to at least one diode as program selector. The diode as program selector can be built from a junction diode with a P+ active on an N well and an N+ active on the same N well as the two terminals of the diode, respectively. In another embodiment, the diode can be built in a polysilicon structure with two ends implanted by P+ and N+ dopants, respectively, as the two terminals of the diode. In yet another embodiment, the diode can be built in an isolated active region with two ends implanted by P+ and N+ dopants, respectively, as the two terminals of the diode. The P+ and N+ terminals of either junction diode, polysilicon diode, or active-region diode can be implanted with the same source or drain implants of CMOS devices in standard CMOS processes, and the well of the junction diode can be fabricated from CMOS wells.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

Embodiments disclosed herein use various data protection schemes to enable/disable reading or writing 0/1, and/or scrambling addresses or data for a programmable resistive device using diode as program selector. Scrambling addresses or data can be further assisted with at least one key. The diode as program selector can be a junction diode, polysilicon diode, or active-region diode. The junction diode can be built with a P+ active on N well and an N+ active on the same N well as two terminals of the diode, respectively. The polysilicon diode can be built on a polysilicon structure with two ends implanted by P+ and N+ implants, respectively, as two terminals of a diode. The active-region diode can be built on an isolated active region with two ends implanted by P+ and N+ implants, respectively, as two terminals of a diode. The two terminals of the junction, polysilicon, or active-region diode can be implanted with the same source or drain implant in CMOS devices, such that these devices can be formed in an efficient and cost effective manner. There are no additional masks or process steps to save costs. The programmable resistive device can also be included within an electronic system.

Figure 1A:
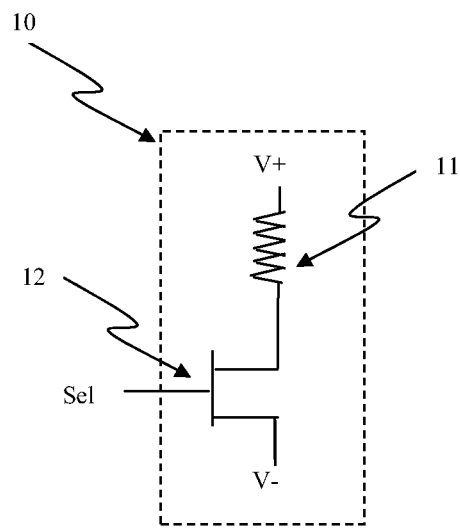
FIG. 1(a) shows a conventional programmable resistive memory cell using MOS as program selector in a prior art.
Figure 1B:
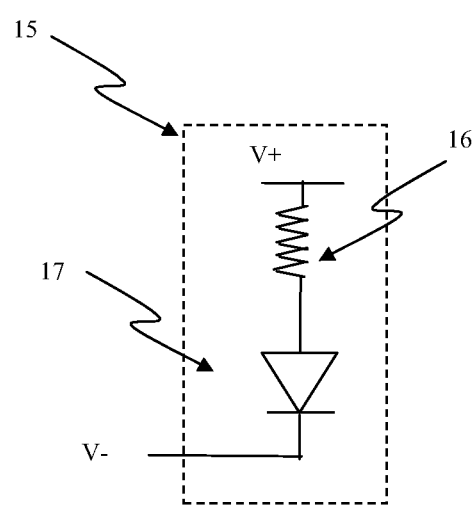
FIG. 1(b) shows another conventional programmable resistive cell using diode as program selector in a prior art.
Figure 2:
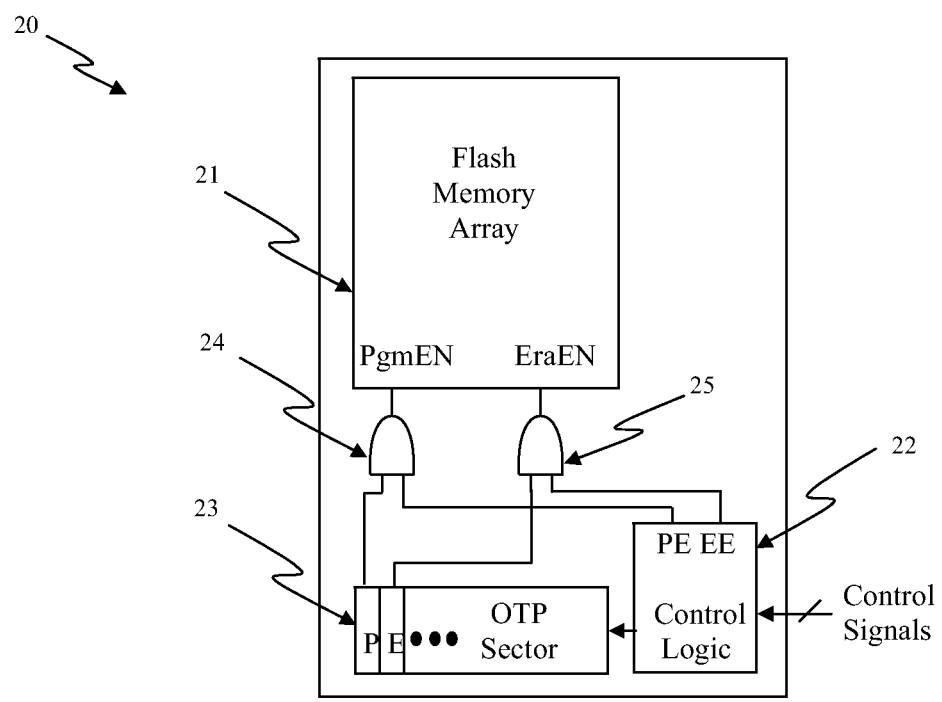
FIG. 2 shows an MCU embedded with flash memory and using OTP memory for data protection in a prior art.
Figure 3:
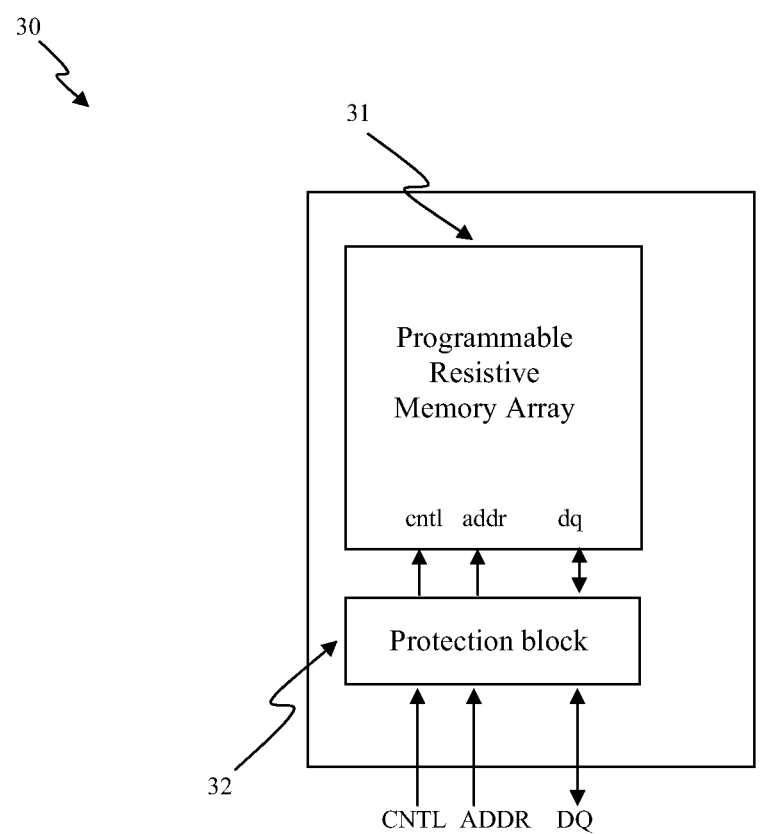
FIG. 3 shows a block diagram of data protection mechanisms for programmable resistive memory according to the present invention.

FIG. 3 shows a block diagram of a programmable resistive memory 30 with data protection according to the present invention. The programmable resistive memory 30 has at least one programmable resistive memory array 31 and at least one data protection block 32. In particular, the protection block 32 includes a write lock bit, read lock bit, address scramble bit, or data scramble bit. The protection block 32 can also include a single or a plurality of keys for scrambling. The write lock bit can disable writing programmable resistive memory array when asserted. The read lock bit can disable reading programmable resistive memory array when asserted. The external control signal CNTL can be gated by the lock bits as a control signal cntl of the main array. The address scramble bit can enable address scrambling for ADDR as address addr of the main array when asserted. And the data scramble bit can enable data scrambling for DQ as the data dq of the main array when asserted. Furthermore, the address or data scrambling can be assisted with an address or data scramble key for different scramble algorithms. If the write and read scramble bits are enabled and the scramble key is provided, the data will be scrambled (encrypted) when writing into the main array and descrambled (decrypted) when reading from the main array. The lock bits, scramble bits, or scramble keys can be built in the same programmable resistive cells as the main array.

Figure 4:
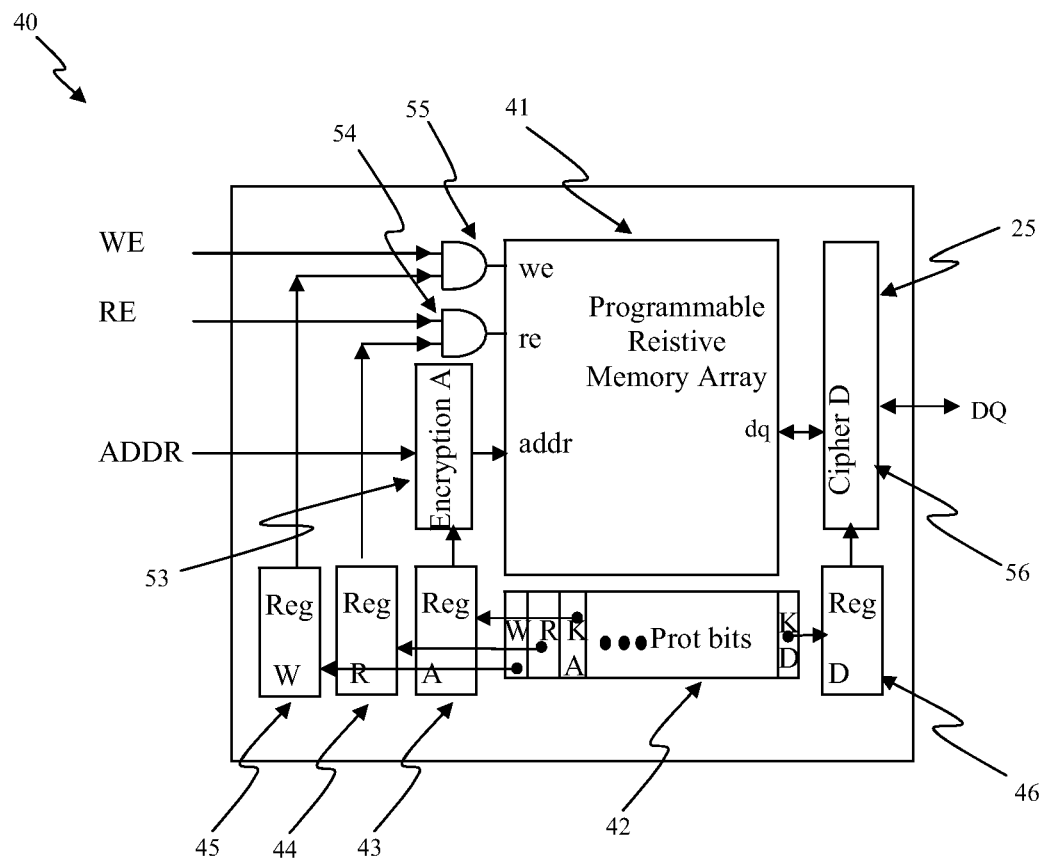
FIG. 4 shows a block diagram of programmable resistive memory with data protection according to one embodiment.

FIG. 4 shows a block diagram of a portion of programmable resistive memory 40 with data protection scheme according to one embodiment. The programmable resistive memory 40 includes at least one programmable resistive memory array 41 and at least one register 42 having at least one protection bits. The protection bit register 42 is non-volatile and has a write lock bit W, read lock bit R, address lock bit with a key KA, and data lock bit with a key KD. Upon activation, the bits W, R, KA, and KD are read from the protection bit register 42 and loaded into the volatile registers RegW 45, RegR 44, RegA 43, and RegD 46, respectively. The RegW 45 is used to AND an external write enable signal WE in gate 55 to generate a write enable we for the main array 41. The RegR 44 is used to AND an external read enable signal RE in gate 54 to generate a read enable re for the main array 41. This bit can be used to prevent reading data to external pins in an embedded memory. The RegA 43 is used to enable external addresses ADDR generating an internal address addr for the main array in the Encryption A 53. A key as part of the RegA 43 can be used for Encryption A 53 in one embodiment. Similarly, the RegD 46 is used to enable scrambling external data DQ and generating internal I/O dq for the main array in the Cipher D 56. A key as part of the RegD 46 can be used for data scrambling or descrambling in Chipher D in one embodiment.

The protection bit register 42 is a non-volatile register (i.e. keep data while the power is cutoff), while the RegW 54, RegR 44, RegA 43, and RegD 46 are volatile registers (loss data while the power is cutoff). The protection bit register 42 can be accessed and loaded into the respective volatile registers 43-46 during power-on reset or by asserting a Chip Select (CS) signal. Each protection bit of W, R, KA, or KD can be a single bit or a plurality of bits and can be implemented in part, all, or in any combination in another embodiment. The key for address or data scrambling can be included in address lock bit KA or data lock bits KD, respectively, or none, in another embodiment. In one embodiment, there can be a plurality of address lock bits to protect a portion of the main array from being read or written. The protection bit register 42 is preferable built by the same kind of memory cell as in the main array 41. In one embodiment the protection bit register 42 can be built as one additional row or one additional column of the main array 42. In some embodiments, the protection bit registers includes a plurality of stand-alone non-volatile cells that can be read or programmed directly without the need for volatile registers. The above discussion is for illustration purposes, there are many varieties of configurations that can be embodied in part, all, or in any combinations and that are still within the scope of this invention, for those skilled in the art.

Figure 5:
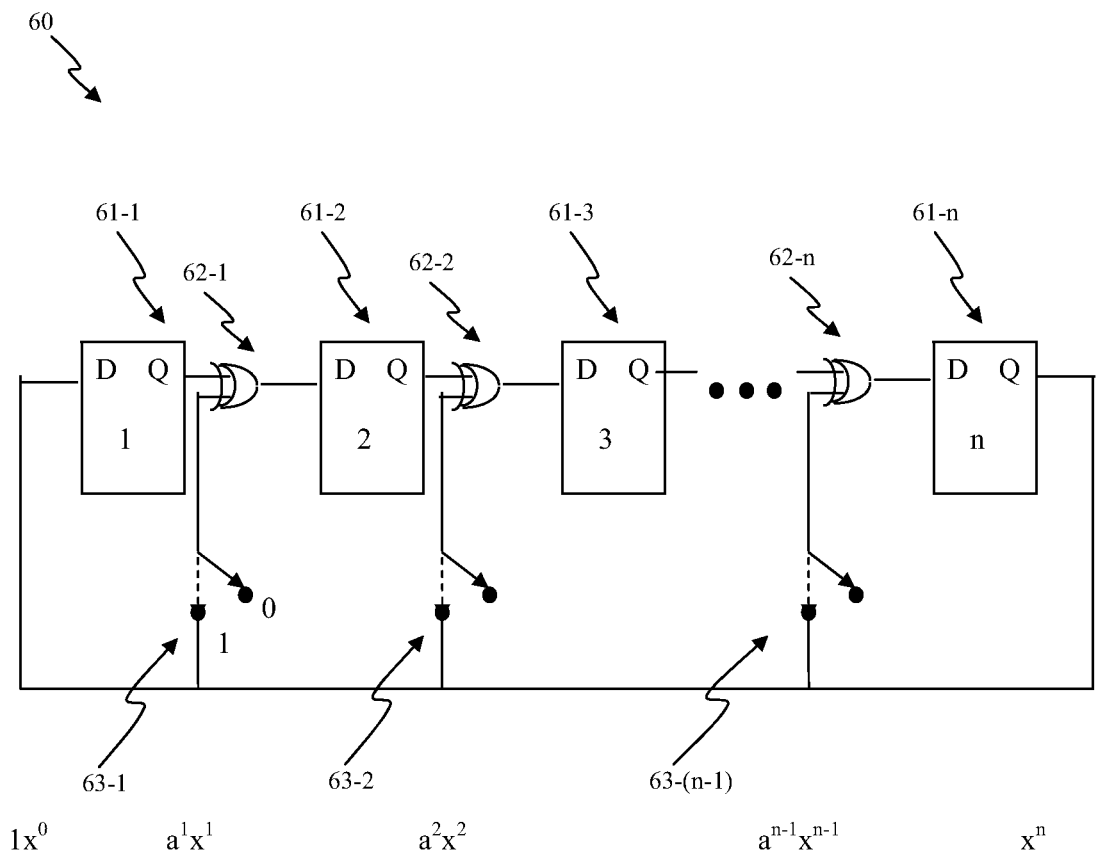
FIG. 5 shows a block diagram of one embodiment of address or data scrambling using LFSR.

FIG. 5 shows a Linear Feedback Shift Register (LFSR) 60 as one embodiment for scrambling address or data. The LFSR 60 has n-registers, 61-1 through 61-n, connected in serial. Each register is coupled to the next register through an XOR except 61-n to 61-1, i.e. the output of 61-1 is an input to an XOR 62-1 whose output is an input of the next register 61-2, etc. The other input of the XOR 62-1 is a switch 63-1 that can be coupled to 0 or to 1, i.e. to ground or to the output of the last register 61-n, respectively. The switches can be hardwired to 0 or 1, or can be controlled by a key to determine the connectivity. With proper setting in the switches, the register contents can be unique and have a run length of $2^n-1$.

The operation of LFSR is very well known and can be found in almost any textbooks in logic design. A polynomial generator $x^n + a_{n-1}x^{n-1} + \ldots + a_2x^2 + a_1x + 1$ can be assigned to a LFSR, where $a_i$ is the value of the switch 62-i, i.e. $a_i=0$, if the switch 62-i is coupled to ground, or $a_i=1$, if the switch 62-i is coupled to the output of the register 61-n. If the polynomial generator is primitive in the Galois Field of 2, the maximum length of the LFSR is $2^n-1$, if the initial state is not 0s for all register outputs. A LFSR can be used to scramble address or data, or to generate pseudo-random numbers in many applications.

Figures 6A, 6B:
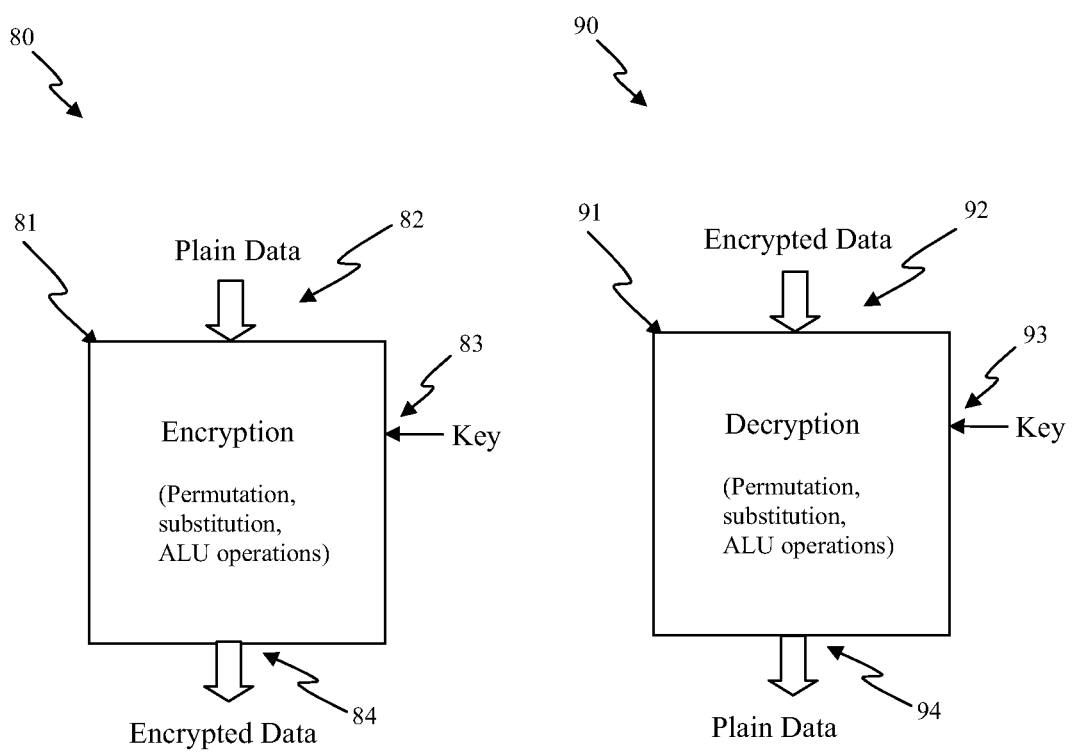
FIG. 6(a) shows a block diagram of an address or data encryption scheme for a programmable resistive memory.
FIG. 6(b) shows a block diagram of an address or data decryption scheme for a programmable resistive memory.

Address or data of the main array of a programmable resistive memory can be encrypted or decrypted with a key as shown in FIGS. 6(*a*) and 6(*b*), respectively. In general, the encryption/decryption can be described as:

$$E_k(M) = C; \; E^{-1}{}_k(C) = M;$$

where E is an encryption operation, $E^{-1}$ is a decryption operation, M is the plain data, and C is the cipher data.

FIG. 6(*a*) shows a block diagram 80 of encryption engine 81 with plain data 82 and key 83 as inputs to Encryption block 81 to produce encrypted data 84 in the output. The encryption operations in Encryption block 81 can be arithmetic/logic (ALU) operation, permutation, or substitution of the plain data 82 with or without a key 83. Simple addition, subtraction, or bitwise XOR with a key is commonly used in encryption. Permutation of the plain data 82 with permutation table generated by a key 83 can also be used. Substituting one data with the other instructed by a key 83, such as in the so-called S-box, is also commonly used in the encryption. Combination of ALU, permutation, or substitution can also be used to in encryption/decryption as in the standard DES, or AES.

FIG. 6(*b*) shows a block diagram 90 of decryption engine 91 with encrypted data 92 and key 93 as inputs to Decryption block 91 to produce decrypted data (plain data) 94 in the output. Decryption is an inverse operation of the encryption. The decryption operations can be arithmetic/logic (ALU) operation, permutation, or substitution of the encrypted data 92 with a key 93, similar to the encryption operations. The key 93 for decryption can be the same key 83 as in the encryption, or can be generated from the key 83 with some operations. Simple addition, subtraction, or bitwise XOR with a key is commonly used in decryption. Permutation of the encrypted data 92 with permutation table generated by a key 93 can also be used. Substituting one data with the other instructed by a key 93, such as in the so-called S-box, is also commonly used in the decryption. Combination of ALU, permutation, or substitution can also be used in encryption/decryption as in the standard DES, or AES.

Figure 7:
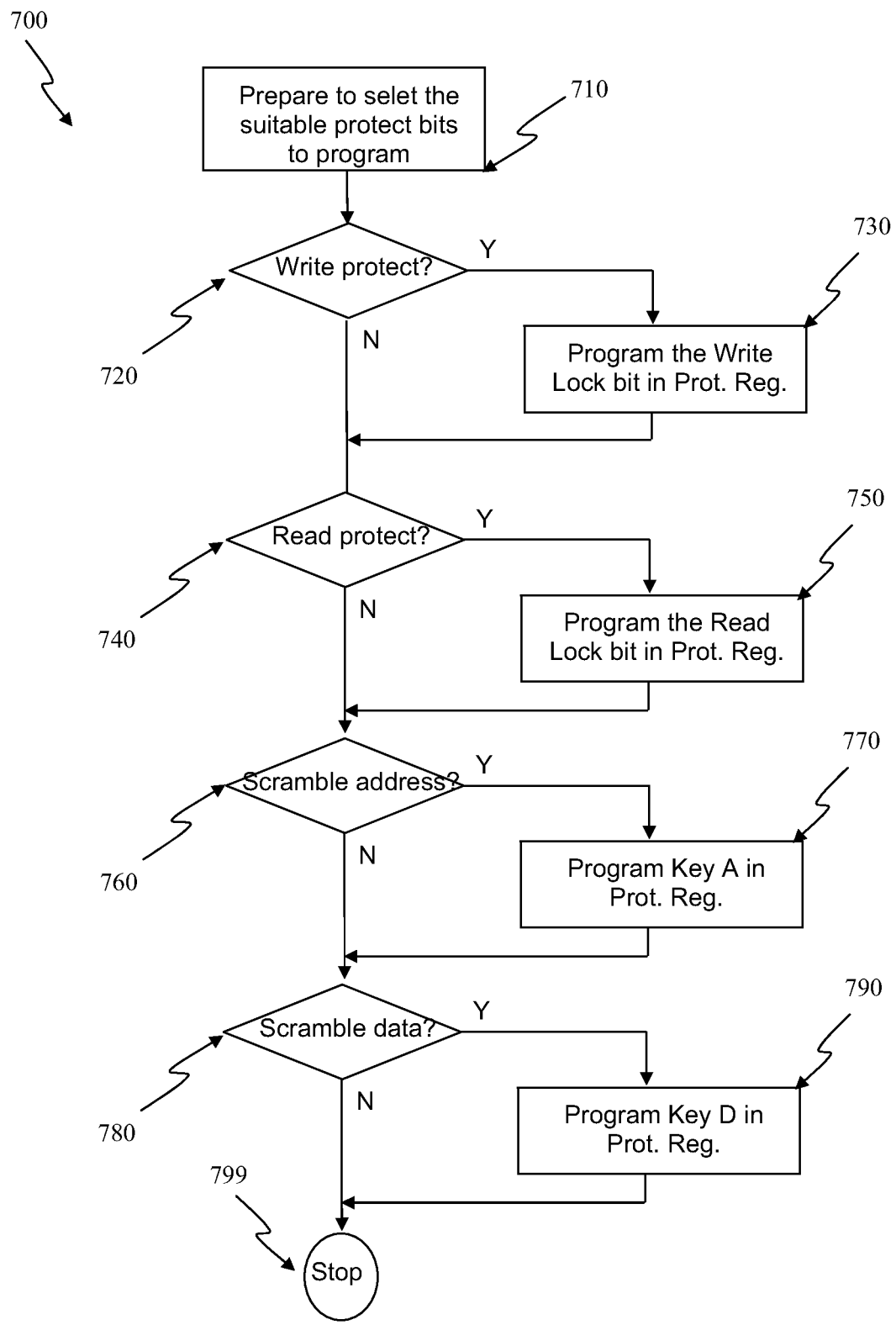
FIG. 7 depicts a method in a flow chart to enable various protection bits for a programmable resistive memory.

FIG. 7 shows a flow chart 700 depicting a method for programming protection bits in a programmable resistive memory, according to one embodiment. The procedure starts at 710 to prepare for programming various protection bits. First, determine if the write operation will be protected in 720. If yes, program the write lock bit W in the protection register in 730 and go to 740. If no, go to the next test in 740. Second, determine if the read operation will be protected in 740. If yes, program the read lock bit R in the protection register in 750 and go to 760. If no, go to the next test in 760. Third, determine if the addresses need to be scrambled in 760. If yes, program the address scramble bit and key, if any, in the protection bit register and go to 780. If no, go to the next test in 780. Fourth, determine if the data need to be scrambled in 780. If yes, program the data scramble bit and key, if any, in the protection bit register in 790 and go to stop 799. If no, go to stop 799.

Figure 8:
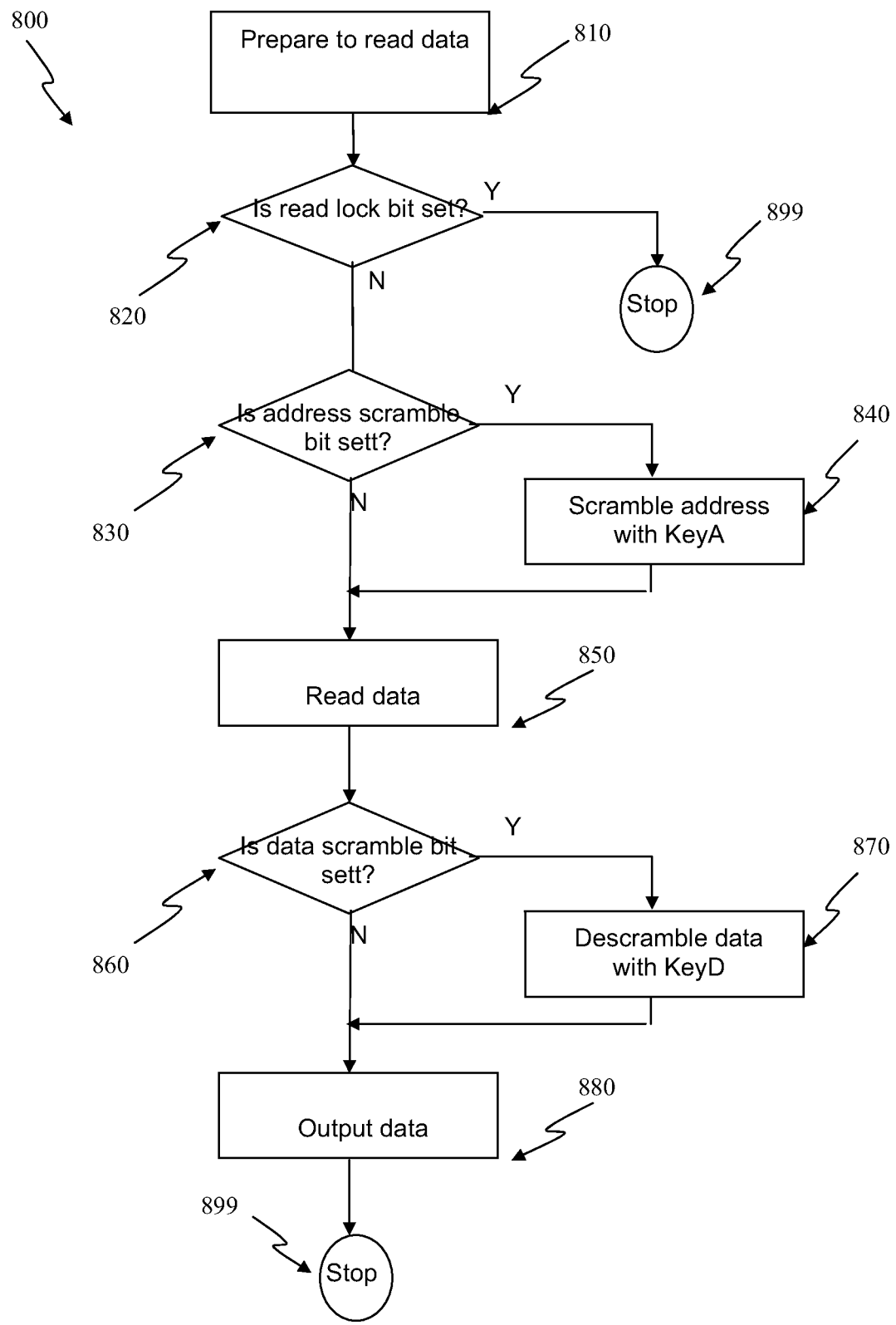
FIG. 8 depicts a method in a flow chart to read a programmable resistive memory with data protection mechanisms.

FIG. 8 shows a flow chart 800 depicting a method for reading data from a programmable resistive memory, according to one embodiment. The procedure starts at 810 to prepare reading data from a programmable resistive memory such as reading the contents of the protection bit register and loading them into the volatile registers such as RegR, etc. First, determine if the read lock bit is set in RegR in 820. If yes, stop read and abort the operation in 899. If no, determine if the address scramble bit is set in RegA in 830. If yes, scramble the input addresses with a key in RegA, if any, in 840. If no, no address scrambling occurs. The addresses are then used to read data in the programmable resistive memory in 850. Then, determine if the data scramble bit is set in RegD in 860. If yes, descramble the data with a key in RegD, if any, in 870. If no, no data descrambling occurs. The final data can be prepared to output in 880 and then stop the operation in 899.

Figure 9:
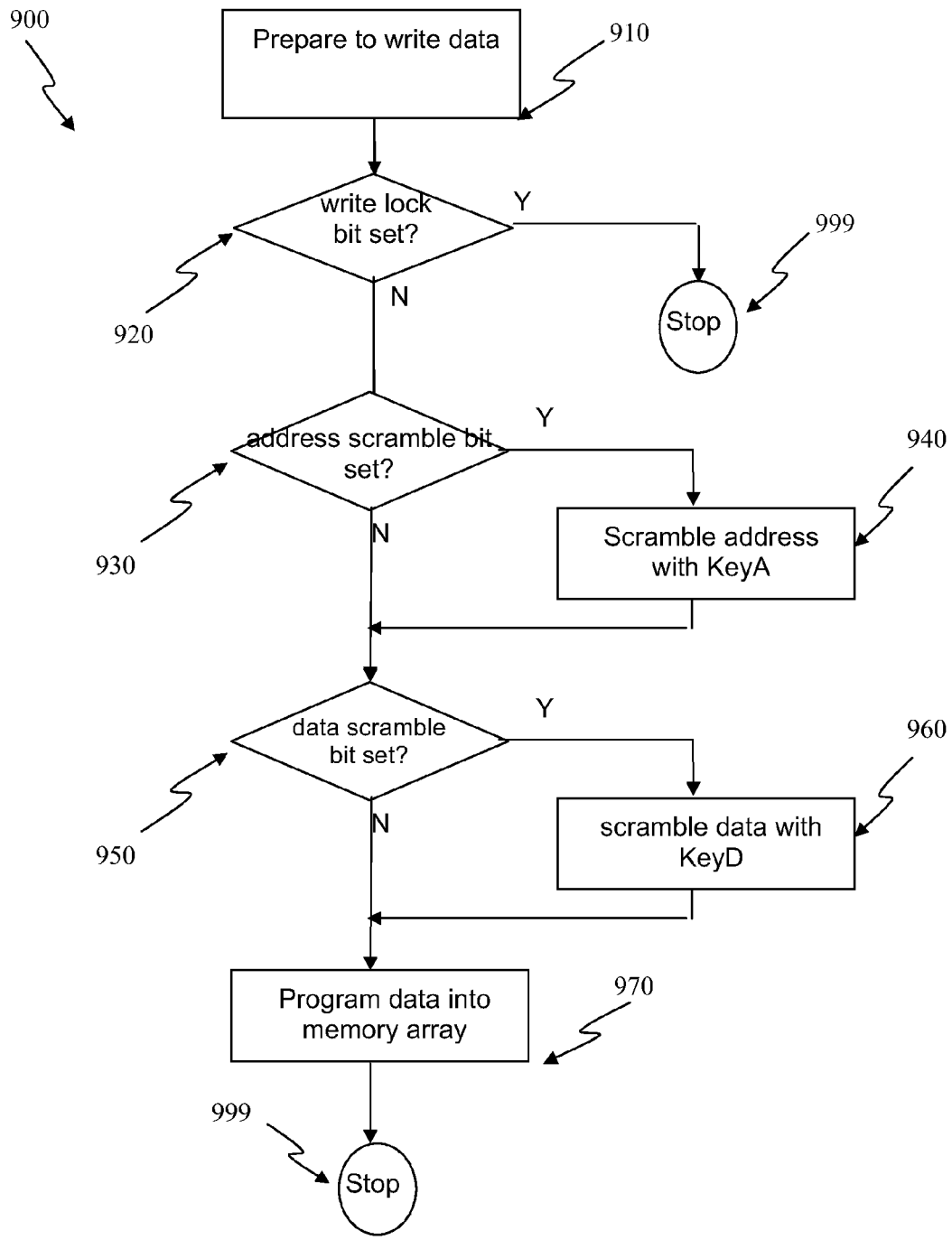
FIG. 9 depicts a method in a flow chart to write a programmable resistive memory with data protection mechanisms.

FIG. 9 shows a flow chart 900 depicting a method for writing data into a programmable resistive memory, according to one embodiment. The procedure starts at 910 to prepare writing data into a programmable resistive memory such as reading the contents of the protection bit register and loading them into the volatile registers such as RegW, etc. First, determine if the write lock bit is set in RegW in 920. If yes, stop write and abort the operation in 999. If no, determine if the address scramble bit is set in RegA in 930. If yes, scramble the input addresses with a key in RegA, if any, in 940. If no, no address scrambling occurs. The addresses then can be used to write data into the programmable resistive memory. Then, determine if the data scramble bit is set in RegD in 950. If yes, scramble the data with a key in RegD, if any, in 960. If no, no data scrambling occurs. The final data can be prepared to be written into the programmable resistive memory in 970 and then stop the operation in 999.

FIGS. 7, 8, and 9 show flow charts depicting methods of a setting protection bit register method 700, a read method 800 and a write method 900, respectively, for a programmable resistive memory in accordance with certain embodiments. The methods 700, 800, and 900 are described in the context a programmable resistive memory, such as the programmable resistive memory 40 in FIG. 4. In addition, although described as a flow of steps, one of ordinary skilled in the art will recognize that at least some of the steps may be performed in a different order, including simultaneously, or skipped.

Figure 10:
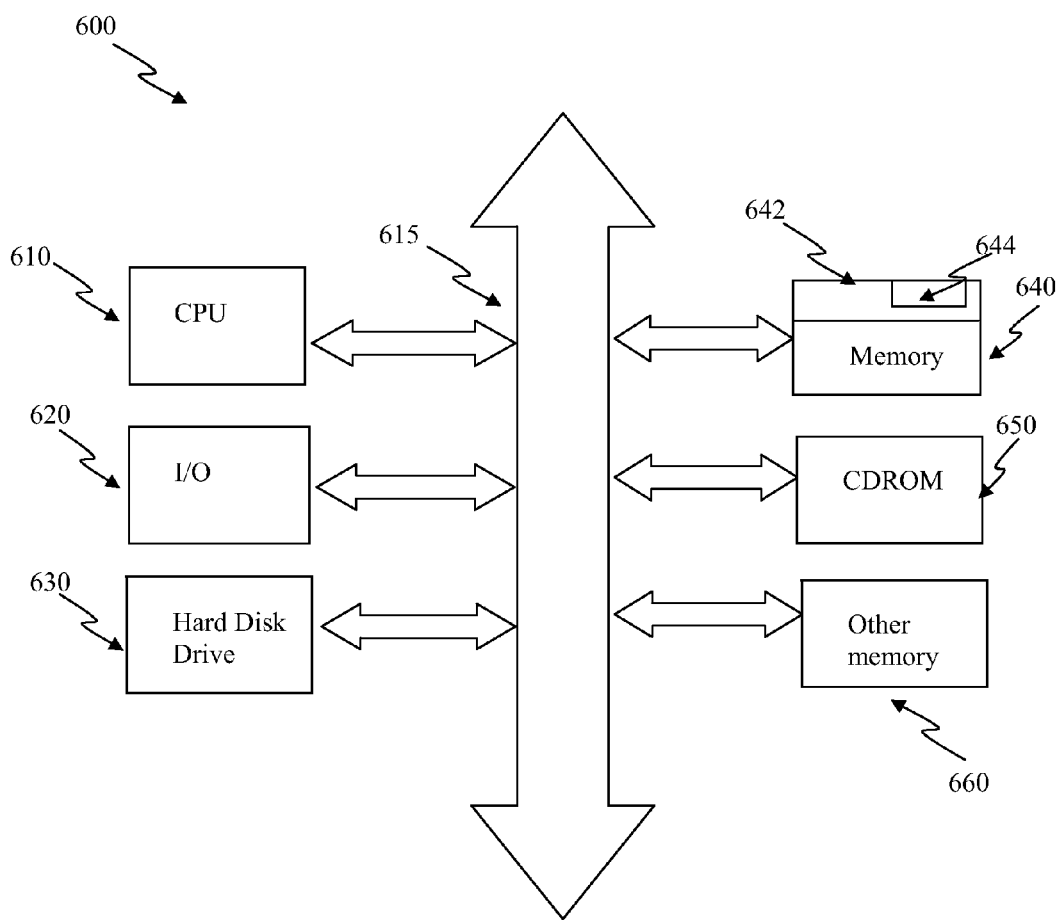
FIG. 10 shows a processor system using programmable resistive memory with data-protection schemes according to one embodiment.

FIG. 10 shows a processor system 600 according to one embodiment. The processor system 600 can include a programmable resistive device 644, such as in a cell array 642, in programmable resistive memory 640, according to one embodiment. The processor system 600 can, for example, pertain to a computer system. The computer system can include a Central Process Unit (CPU) 610, which communicate through a common bus 615 to various memory and peripheral devices such as I/O 620, hard disk drive 630, CDROM 650, programmable resistive memory 640, and other memory 660. Other memory 660 is a conventional memory such as SRAM, DRAM, or flash, typically interfaces to CPU 610 through a memory controller. CPU 610 generally is a microprocessor, a digital signal processor, or other programmable digital logic devices. Memory 640 is preferably constructed as an integrated circuit, which includes the memory array 642 having at least one programmable resistive device 644. The memory 640 typically interfaces to CPU 610 through a memory controller. If desired, the memory 640 may be combined with the processor, for example CPU 610, in a single integrated circuit.

Embodiments of the invention can be applied to any programmable resistive memory that has programmable resistive cells including a programmable resistive element coupled to at least one program selectors. The programmable resistive element can be an OTP element that can be a fuse or anti-fuse. The fuse can be an interconnect fuse or a single or plural of contact/via fuse. The interconnect fuse can include polysilicon, silicided polysilicion, metal, metal alloy, thermally isolated active region, or some combinations thereof. One of the most common fuse is a CMOS gate used as an interconnect. The anti-fuse can be a contact/via with dielectric in between, or a CMOS gate coupled to a CMOS body with gate oxide in between. A diode can be used as program selector. The diode can be a junction diode constructed from a P+ active region on N well and an N+ active region on the same N well as the P and N terminals of the diode, respectively. In another embodiment, a diode can be constructed from a polysilicon structure with two ends implanted by P+ and N+ implants, respectively, In yet another embodiment, the diode can be an isolated active region with two ends implanted by P+ and N+ implants, respectively. The P or N terminal of junction, polysilicon, or active region diode can be implanted by the same source or drain implant in CMOS devices. Either the junction diode, polysilicon diode, or active region diode can be built in standard CMOS processes without any additional masks or process steps.

The invention can be implemented in a part or all of an integrated circuit in a Printed Circuit Board (PCB), or in a system. The programmable resistive device can be reversible programmable resistive device, such as the emerging nonvolatile memory. The emerging nonvolatile memory can be Magnetic RAM (MRAM), Phase Change Memory (PCM), Conductive Bridge RAM (CBRAM), or Resistive RAM (RRAM). Though the program mechanisms are different, their logic states can be distinguished by different resistance values, and therefore they are all different types of programmable resistive memories.

Additional information on programmable resistive memory structures and their formation and usage can be found in: (1) U.S. patent application Ser. No. 13/026,650, filed on Feb. 14, 2011 and entitled "CIRCUIT AND SYSTEM FOR USING A POLYSILICON DIODE AS PROGRAM SELECTOR FOR RESISTIVE DEVICES IN CMOS LOGIC PROCESSES," which is hereby incorporated herein by reference; (2) U.S. patent application Ser. No. 13/026,725, filed on Feb. 14, 2011 and entitled "CIRCUIT AND SYSTEM FOR USING A JUNCTION DIODE AS PROGRAM SELECTOR FOR RESISTIVE DEVICES," which is hereby incorporated herein by reference; (3) U.S. patent application Ser. No. 13/026,725, filed on Feb. 14, 2011 and entitled "CIRCUIT AND SYSTEM OF USING JUNCTION DIODE AS PROGRAM SELECTOR FOR RESISTIVE DEVICES IN CMOS LOGIC PROCESSES," which is hereby incorporated herein by reference; (4) U.S. patent application Ser. No. 13/026,650, filed on Feb. 14, 2011 and entitled "CIRCUIT AND SYSTEM OF USING POLYSILICON DIODE AS PROGRAM SELECTOR FOR RESISTIVE DEVICES IN CMOS LOGIC PROCESSES," which is hereby incorporated herein by reference; and (5) U.S. patent application Ser. No. 13/471,704, filed on May 15, 2012 and entitled "CIRCUIT AND SYSTEM FOR USING A JUNCTION DIODE AS PROGRAM SELECTOR FOR ONE-TIME PROGRAMMABLE DEVICES," which is hereby incorporated herein by reference.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

The invention claimed is:

1. A programmable resistive memory, comprising:
a plurality of programmable resistive cells, at least one of the programmable resistive cells comprising:
a programmable resistive element coupled to at least one diodes as program selectors fabricated in standard CMOS process; and
at least one non-volatile register to store protection bit information, and
wherein the data stored in the non-volatile register being operable to scramble addresses or data when accessing the programmable resistive memory.

2. A programmable resistive memory as recited in claim 1, wherein the non-volatile register stores at least one bit to enable/disable reading a certain portion of the programmable resistive memory.

3. A programmable resistive memory as recited in claim 1, wherein the non-volatile register stores at least one bit to enable/disable writing a certain portion of the programmable resistive memory.

4. A programmable resistive memory as recited in claim 1, wherein the non-volatile register stores at least one key to scramble the addresses or data when accessing the programmable resistive memory.

5. A programmable resistive memory as recited in claim 1, wherein the programmable resistive element can only be programmed once.

6. A programmable resistive element as recited in claim 5, wherein the programmable resistive element is a fuse that includes at least a portion of polysilicon, silicided polysilicion, metal, metal alloy, thermally isolated active region, contact, or via.

7. A programmable resistive element as recited in claim 5, wherein the programmable resistive element is a anti-fuse that includes at least one of a dielectric-breakdown anti-fuse or a gate oxide breakdown anti-fuse.

8. A programmable resistive memory as recited in claim 1, wherein the programmable resistive memory is a phase-change RAM(PCRAM), resistive RAM(RRAM), Conductive Bridge RAM(CBRAM), or Magnetic RAM(MRAM).

9. A programmable resistive memory cell as recited in claim 1, wherein the diode is a junction diode with two terminals built by at least one active regions on a CMOS well and implanted by a source or drain implant in a CMOS process.

10. A programmable resistive cell as recited in claim 1, wherein the diode is built on a polysilicon structure with two terminals implanted by a source or drain implant in a CMOS process.

11. A programmable resistive cell as recited in claim 1, wherein the diode is built on an isolated active region with two terminals implanted by a source or drain implant in a CMOS process.

12. A programmable resistive memory as recited in claim 1, wherein the non-volatile register is built with the same kind of cells as the programmable resistive element.

13. An electronics system, comprising:
a processor; and
a programmable resistive memory operatively connected to the processor, the programmable resistive memory includes at least a plurality of programmable resistive cells for providing data storage, each of the programmable resistive cells comprising:
   a programmable resistive element coupled to at least one diodes as program selectors fabricated in a standard CMOS process; and
   at least one non-volatile register to store protection bit information,
wherein the data stored in the non-volatile register being used to scramble addresses or data when accessing the programmable resistive memory.

14. A programmable resistive memory as recited in claim 13, wherein the non-volatile register stores at least one bit to enable/disable reading or writing a certain portion of the programmable resistive memory.

15. A programmable resistive memory as recited in claim 13, wherein the non-volatile register stores at least one key to scramble the addresses or data when accessing the programmable resistive memory.

16. A programmable resistive memory as recited in claim 13, wherein the programmable resistive element can only be programmed once.

17. A programmable resistive memory as recited in claim 13, wherein the programmable resistive memory is a phase-change RAM(PCRAM), resistive RAM(RRAM), Conductive Bridge RAM(CBRAM), or Magnetic RAM(MRAM).

18. A method for protecting data stored in a programmable resistive memory, comprising:
   providing a plurality of programmable resistive cells, at least one of the programmable resistive cells include at least one programmable resistive elements coupled to at least one diodes as program selectors fabricated in a standard CMOS process, and (ii) at least one non-volatile protection bit register to store protection bit information, and
   enabling or disabling scrambling address or data when accessing the programmable resistive memory, based on the data stored in the non-volatile protection bit register.

19. A programmable resistive memory as recited in claim 18, wherein the non-volatile protection bit register stores at least one bits to enable/disable reading or writing a certain portion of the programmable resistive memory.

20. A One-Time Programmable (OTP) Memory, comprising:
   a plurality of OTP cells, at least one of the OTP cells comprising:
      an OTP element coupled to at least one diodes as program selectors fabricated in standard CMOS process; and
      at least one non-volatile protection register to store protection bit information, and
   wherein the data stored in the non-volatile protection register for scrambling addresses or data when accessing the programmable resistive memory.

* * * * *